(12) United States Patent
Cheng et al.

(10) Patent No.: US 9,899,515 B1
(45) Date of Patent: Feb. 20, 2018

(54) FABRICATION OF A PAIR OF VERTICAL FIN FIELD EFFECT TRANSISTORS HAVING A MERGED TOP SOURCE/DRAIN

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/339,072

(22) Filed: Oct. 31, 2016

(51) Int. Cl.
| | |
|---|---|
| H01L 21/336 | (2006.01) |
| H01L 29/78 | (2006.01) |
| H01L 29/66 | (2006.01) |
| H01L 29/08 | (2006.01) |
| H01L 29/10 | (2006.01) |
| H01L 21/8234 | (2006.01) |
| H01L 21/762 | (2006.01) |
| H01L 27/088 | (2006.01) |
| H01L 29/06 | (2006.01) |
| H01L 27/092 | (2006.01) |
| H01L 21/8238 | (2006.01) |

(52) U.S. Cl.
CPC .... *H01L 29/7827* (2013.01); *H01L 21/76224* (2013.01); *H01L 21/823475* (2013.01); *H01L 21/823487* (2013.01); *H01L 21/823878* (2013.01); *H01L 21/823885* (2013.01); *H01L 27/088* (2013.01); *H01L 27/092* (2013.01); *H01L 29/0649* (2013.01); *H01L 29/0847* (2013.01); *H01L 29/1037* (2013.01); *H01L 29/66545* (2013.01); *H01L 29/66666* (2013.01)

(58) Field of Classification Search
CPC .............. H01L 29/785; H01L 29/7848; H01L 29/0847; H01L 29/7831; H01L 29/78642; H01L 29/66666; H01L 29/7827; H01L 21/02639; H01L 21/823487; H01L 21/845
USPC ....................................................... 438/268
See application file for complete search history.

(56) References Cited

U.S. PATENT DOCUMENTS

| 7,446,025 B2 | 11/2008 | Cohen et al. |
| 7,683,428 B2 | 3/2010 | Chidambarrao et al. |

(Continued)

OTHER PUBLICATIONS

Bardon et al., "Layout-induced stress effects in 14nm & 10nm FinFETs and their impact on performance", 2013 Symposium on VLSI Technology (VLSIT). Published by IEEE. INSPEC Accession No. 13698368. Symposium held Jun. 11-13, 2013. pp. T114-T115.

(Continued)

*Primary Examiner* — Duy T Nguyen
(74) *Attorney, Agent, or Firm* — Tutunjian & Bitetto, P.C.; Vazken Alexanian

(57) ABSTRACT

A method of fabricating a vertical fin field effect transistor with a merged top source/drain, including, forming a source/drain layer at the surface of a substrate, forming a plurality of vertical fins on the source/drain layer; forming protective spacers on each of the plurality of vertical fins, forming a sacrificial plug between two protective spacers, forming a filler layer on the protective spacers not in contact with the sacrificial plug, and selectively removing the sacrificial plug to form an isolation region trench between the two protective spacers.

13 Claims, 12 Drawing Sheets

(56) References Cited

U.S. PATENT DOCUMENTS

| | | |
|---|---|---|
| 7,892,956 B2 | 2/2011 | Deligianni et al. |
| 8,455,334 B2 | 6/2013 | Bangsaruntip et al. |
| 8,637,849 B2 | 1/2014 | Deligianni et al. |
| 8,993,406 B1 | 3/2015 | Kerber et al. |
| 9,299,835 B1 | 3/2016 | Anderson et al. |
| 2012/0052640 A1* | 3/2012 | Fischer ............ H01L 21/82342 438/268 |
| 2015/0214365 A1* | 7/2015 | Xie .................... H01L 29/7842 257/369 |
| 2015/0243745 A1* | 8/2015 | Kelly ................ H01L 29/41766 257/369 |
| 2015/0325692 A1 | 11/2015 | Zang |

OTHER PUBLICATIONS

Yakimets et al., "Vertical GAAFETs for the Ultimate CMOS Scaling", IEEE Transactions on Electron Devices, vol. 52, No. 5. Published by IEEE. May 2015. pp. 1433-1439.

\* cited by examiner

U.S. 9,899,515 B1

FABRICATION OF A PAIR OF VERTICAL FIN FIELD EFFECT TRANSISTORS HAVING A MERGED TOP SOURCE/DRAIN

BACKGROUND

Technical Field

The present invention generally relates to adjacent vertical fin field effect transistors (FinFETs) having a merged top source/drain, and more particularly to fabricating two vertical fin field effect transistors electrically coupled through a merged top source/drain.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate in the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment of the present invention, a method of fabricating adjacent vertical fin field effect transistors with a merged top source/drain is provided. The method includes forming a source/drain layer at the surface of a substrate, forming a plurality of vertical fins on the source/drain layer. The method further includes forming protective spacers on each of the plurality of vertical fins. The method further includes forming a sacrificial plug between two protective spacers. The method further includes forming a filler layer on the protective spacers not in contact with the sacrificial plug, and selectively removing the sacrificial plug to form an isolation region trench between the two protective spacers.

In accordance with another embodiment of the present invention, a method of fabricating two vertical fin field effect transistors electrically coupled through a merged top source/drain is provided. The method includes forming a source/drain layer on a substrate, forming at least four vertical fins on the source/drain layer. The method further includes forming an isolation region through the source/drain layer to separate the source/drain layer into a first bottom source/drain and a second bottom source/drain, wherein at least two of the least four vertical fins are on the first bottom source/drain, and at least two of the least four vertical fins are on the second bottom source/drain. The method further includes forming a top source/drain on each of the at least four vertical fins, wherein the top source/drains are formed to a size that is sufficient for at least two top source/drains to coalesce into a merged source/drain.

In accordance with another embodiment of the present invention, an adjoined pair of vertical fin devices is provided. The adjoined pair of vertical fin devices includes a first bottom source/drain and a second bottom source/drain on a substrate, wherein the first bottom source/drain is separated from the second bottom source/drain by a shallow trench isolation region in the substrate. The adjoined pair of vertical fin devices further includes at least four vertical fins, wherein at least two of the at least four vertical fins are on the first bottom source/drain and at least two of the at least four vertical fins are on the second bottom source/drain. The adjoined pair of vertical fin devices further includes a gate structure on each of the at least four vertical fins. The adjoined pair of vertical fin devices further includes a top source/drain on at least one of the at least two vertical fins on the first bottom source/drain, a top source/drain on at least one of the at least two vertical fins on the second bottom source/drain, and a merged source/drain on one vertical fin on the first bottom source/drain and one adjacent vertical fin on the second bottom source/drain that bridges the shallow trench isolation region to electrically couple the adjacent vertical fins.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
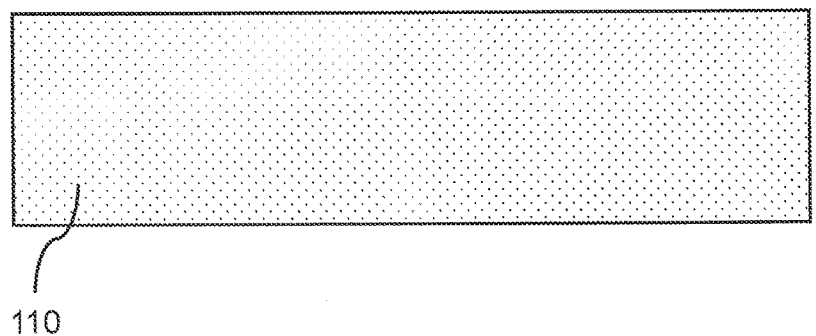
FIG. 1 is a cross-sectional side view showing a substrate, in accordance with an embodiment of the present invention.

Principles and embodiments of the present invention relate generally to avoiding first level metallic interconnects between adjacent FinFETs by fabricating top source/drains on vertical fins that merge into a single top source/drain that spans the two vertical fins. Typically, different electrical contacts are formed to the top source/drain on each vertical fin, and interconnecting the electrical contacts through a metallization layer. By epitaxially growing the top source/drain until two separate top source/drains amalgamate into a merged source/drain, additional steps and metallization connects can be avoided.

In addition, a self-aligned isolation region can be formed between the two coupled FinFET devices, where the isolation region can be self-aligned with the gate structures on the adjacent devices, and the merged top source/drain can bridge the isolation region to electrically couple the adjacent vertical fins. The self-aligned isolation region (e.g. shallow trench isolation (STI) region) can be adjacent to and in contact with spacers on the sidewalls of a vertical fin, where the thickness of the spacer(s) can determine the distance of the isolation region from the vertical fin(s). The gate lengths on both sidewalls of a vertical fin can be the same, and the gate lengths on two adjacent vertical fins can be the same, where increased consistency of the gate lengths can improve device performance.

Principles and embodiments of the present invention also relate to use of a pinch-off layer to locate a sacrificial plug between two closely spaced vertical fins to align the isolation region with the two vertical fins and gate structures formed thereon. Control of different distances between a plurality of vertical fins and/or selective fin removal can provide closer spacing between vertical fins intended to be electrically coupled through the merged source/drains, and greater spacing between other fins forming the FinFET device, such that the closer fins are properly spaced for the top source/drains to amalgamate before the other top source/drains grow to a size that shorts the neighboring vertical fins that are farther apart.

Exemplary applications/uses to which the present invention can be applied include, but are not limited to: vertical FinFETs, complementary metal-oxide-semiconductor (CMOS) field effect transistors, digital logic gates (e.g., NAND, NOR, XOR, etc.) and memory devices (e.g., DRAM, SRAM, etc.).

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer may be by one or more deposition processes, where, for example, a conformal layer can be formed by a first process (e.g., ALD, PEALD, etc.) and a fill can be formed by a second process (e.g., CVD, electrodeposition, PVD, etc.).

Reference to source/drain projections, layers, regions, etc., is intended to indicate that the particular device feature can be implemented as a source or a drain except as expressly indicated otherwise. In addition, the role of source and drain for an active device can in some instances be reversed, so a previously indicated drain may instead be a source and vice versa. Reference to a source/drain is, therefore, intended to encompass the broadest reasonable scope of the term.

It is to be understood that aspects of the present invention will be described in terms of a given illustrative architecture; however, other architectures, structures, substrate materials and process features and steps can be varied within the scope of aspects of the present invention.

It should be noted that certain features may not be shown in all figures for the sake of clarity. This is not intended to be interpreted as a limitation of any particular embodiment, or illustration, or scope of the claims.

Referring now to the drawings in which like numerals represent the same or similar elements and initially to FIG. 1, a cross-sectional side view of a substrate is shown, in accordance with an embodiment of the present invention.

In one or more embodiments, a substrate 110 can be a semiconductor or an insulator, or a combination of semiconductor and insulator with an active surface layer (ASL) made of a semiconductor material at the substrate surface. Various portions of the substrate 110 can be crystalline, semi-crystalline, microcrystalline, or amorphous. The substrate can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, GaAs, SiC, or SiGe. In various embodiments, the substrate can include a carrier portion that can be polycrystalline or amorphous, or an insulating material (e.g. glass, $Al_2O_3$, SiC, etc.) and an active surface layer that is a single crystal semiconductor material.

In one or more embodiments, the substrate 110 can have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI), where an active surface semiconductor layer of the substrate 110 can be on a substrate insulator layer (e.g., buried oxide layer (BOX)). The substrate 110 can also have other layers forming the substrate, including high-k oxides and/or nitrides. The substrate 110 can also have other device structures such as isolation regions (not shown). In one or more embodiments, a substrate insulator layer (e.g., BOX layer) can be formed on at least a portion of a substrate 110.

In various embodiments, the substrate 110 may be a single crystal silicon (Si), silicon-germanium (SiGe), or III-V semiconductor (e.g., GaAs) wafer, or have a single crystal silicon (Si), silicon-germanium (SiGe), or III-V semiconductor (e.g., GaAs) active surface layer. In one or more embodiments, the substrate 110 can be a single crystal silicon wafer.

In various embodiments, the substrate can be n-doped (e.g., with phosphorous, arsenic, antimony, etc.) or p-doped (e.g., with boron, gallium, indium, etc.), where the substrate dopant can be a counter-dopant for a bottom source/drain dopant type.

Figure 2:
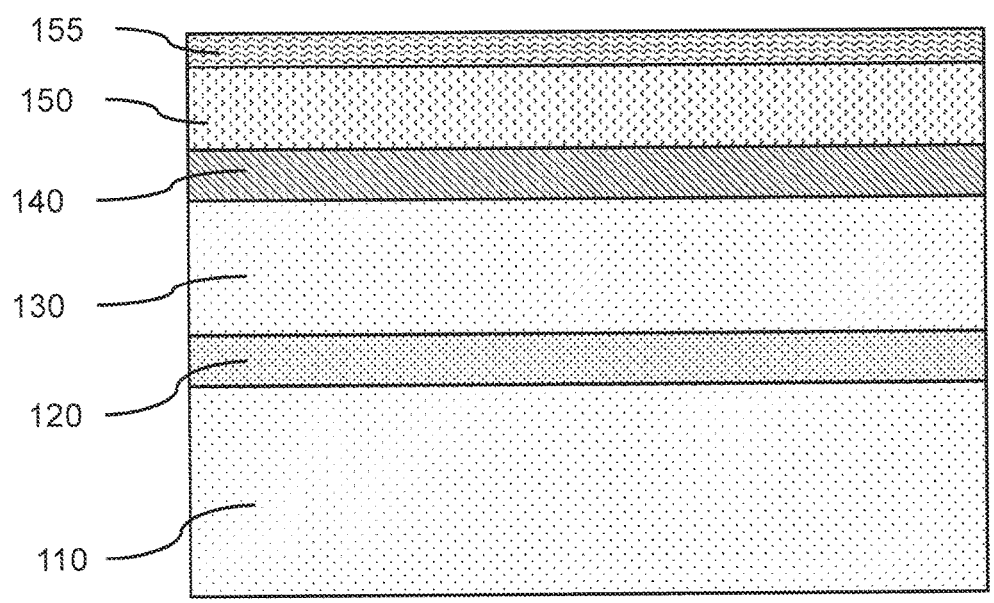
FIG. 2 is a cross-sectional side view showing a bottom source/drain layer at the surface of the substrate, a vertical fin layer on the bottom source/drain layer, a hardmask layer on the vertical fin layer, a sacrificial mandrel layer and a template layer on the hardmask layer, in accordance with an embodiment of the present invention.

FIG. 2 is a cross-sectional side view showing a bottom source/drain layer at the surface of the substrate, a vertical fin layer on the bottom source/drain layer, a hardmask layer on the vertical fin layer, a sacrificial mandrel layer and a template layer on the hardmask layer, in accordance with an embodiment of the present invention.

In one or more embodiments, a bottom source/drain layer 120 can be formed at the surface of the substrate 110, where the bottom source drain layer 120 may be formed from the substrate surface material (e.g., through dopant implantation) or formed on the substrate surface (e.g., by epitaxial growth and in situ or ex situ dopant implantation).

In various embodiments, the bottom source/drain layer 120 can be formed by epitaxial growth on an exposed portion of the substrate 110, and/or dopants can be implanted into the bottom source/drain layer 120. The bottom source/drain layer 120 can be in-situ doped (where doping and epitaxy growth are performed at the same time), and/or ex-situ doped (where doping occurs before and/or after epitaxy). Dopants can be incorporated during epitaxy or by other suitable doping techniques, including but not limited to, ion implantation, gas phase doping, plasma doping, plasma immersion ion implantation, cluster doping, infusion doping, liquid phase doping, solid phase doping, etc. In various embodiments, the bottom source/drain layer 120 can be doped to form n-type or p-type source/drains to fabricate NFETs or PFETs.

In one or more embodiments, a vertical fin layer 130 can be formed on the bottom source/drain layer 120, where a crystalline vertical fin layer can be epitaxially grown on a crystalline bottom source/drain layer 120 having a predetermined crystal orientation. The vertical fin layer 130 can be a crystalline semiconductor material.

In one or more embodiments, the vertical fin layer 130 can be silicon or silicon-germanium, where the vertical fin layer can be strained or unstrained depending on the amount of lattice mismatch between the material of the vertical fin layer 130 and the material of the bottom source/drain layer 120 and/or substrate 110.

In one or more embodiments, a hardmask layer 140 can be formed on the vertical fin layer 130, where the hardmask layer 140 can be patterned to form masks for forming one or more vertical fins.

In one or more embodiments, the hardmask layer 140 can be silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof.

In one or more embodiments, a sacrificial mandrel layer 150 may be formed on at least a portion of the hardmask layer 140. The sacrificial mandrel layer 150 may be a semiconductor material, for example, amorphous silicon (a-Si), polycrystalline silicon (p-Si), microcrystalline silicon (m-Si), amorphous carbon (a-C), or combinations thereof.

In one or more embodiments, a template layer 155 can be formed on the sacrificial mandrel layer 150, where the template layer 155 can be a lithography resist material, for example, an photoresist material or an e-beam resist material (e.g., poly methylmethacralate (PMMA), hydrogen silsequioxane (HSQ), etc.). In various embodiments, the template layer 155 can be spun onto the surface of the sacrificial mandrel layer 150.

Figure 3:
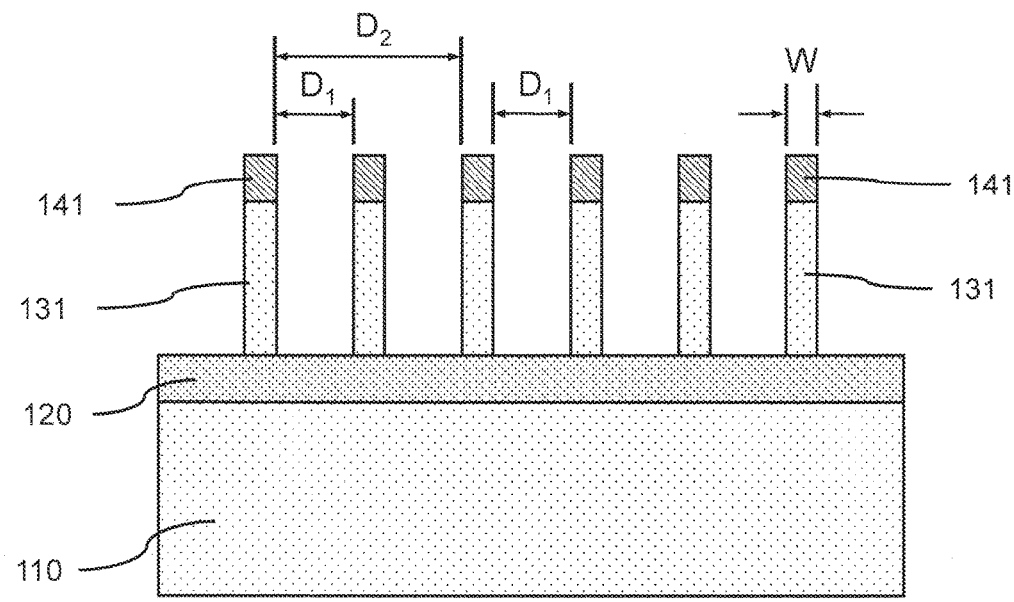
FIG. 3 is a cross-sectional side view showing a plurality of vertical fins with a hardmask cap on each vertical fin, in accordance with an embodiment of the present invention.

FIG. 3 is a cross-sectional side view showing a plurality of vertical fins with a hardmask cap on each vertical fin, in accordance with an embodiment of the present invention.

In one or more embodiments, a vertical fin 131 can be formed on a substrate 110. In various embodiments, the vertical fins 131 can be etched into the vertical fin layer 130 on the bottom source/drain layer 120 by employing a lithographic patterning process, a sidewall image transfer (SIT) process, or epitaxially grown on the substrate. The vertical fin 131 can be formed by a SIT process (i.e., self-aligned double patterning (SADP)), or double sidewall image transfer process (e.g., self-aligned quadruple patterning (SAQP)), as would be known in the art.

In one or more embodiments, the template layer 155 may be formed on at least a portion of the sacrificial mandrel layer 150, where the template layer 155 may be a soft mask that can be patterned and developed to form opening(s) and mask feature(s). In various embodiments, the template layer 155 can be patterned and developed to form one or more mandrel templates that cover a portion of the sacrificial mandrel layer 150, while exposing other portions of the sacrificial mandrel layer 150.

In one or more embodiments, a plurality of sacrificial mandrels can be formed from the sacrificial mandrel layer 150, where an anisotropic etch may be used to form the sacrificial mandrels. An anisotropic etch may be a dry plasma etch, for example, a reactive ion etch (RIE), that preferentially removes material from the sacrificial mandrel layer 150 in a direction normal to the surface, while limiting etching of the sidewalls. The plurality of sacrificial mandrels may act as templates for forming spacers for the SIT process.

In one or more embodiments, the sacrificial mandrels may have a width in the range of about 5 nm to about 60 nm, or in the range of about 10 nm to about 40 nm, where the width of a sacrificial mandrel can define the distance, $D_1$, between two spacers, and thereby, two subsequently formed adjacent vertical fins 131. A distance, $D_2$, between two vertical fins 131 separated by a single intervening vertical fin 131 can be twice the distance $D_1$ plus the width, W, of the intervening vertical fin (i.e., $(2 \times D_1)+W$).

It should be noted that distances $D_1$ and $D_2$ are measured between facing surfaces of the vertical fins 131, whereas pitch is the distance measured between the same face of the vertical fins.

In one or more embodiments, the plurality of sacrificial mandrels may have a pitch between adjacent sacrificial mandrels different from the width of the sacrificial mandrels. The pitch between adjacent sacrificial mandrels may be in the range of about 20 nm to about 200 nm, or in the range of about 70 nm to about 120 nm, or in the range of about 24 nm to about 80 nm, or in the range of about 35 nm to about 100 nm, where the pitch between sacrificial mandrels can control the distance between spacers on the adjacent sacrificial mandrels, and thereby, the distance, $D_2$ between vertical fins 131 separated by an intervening fin.

In one or more embodiments, one or more spacer layer(s) may be formed on one or more of the sacrificial mandrels. The spacer layer(s) can be formed by a blanket deposition over the sacrificial mandrels and exposed portions of the surface of the hardmask layer 140, where the blanket deposition may be a conformal deposition, for example by ALD, CVD, or a combination thereof. The thickness of the spacer layers can be predetermined to control the width, W, of the subsequently formed vertical fins 131, and to vary the pitch between fin templates by introducing additional spacer layers to provide variably spaced vertical fins. Using an SIT process or double SIT process provides chemical process control over critical dimension (CD) resolution (e.g., monolayer thickness resolution for ALD) in place of optical resolution limits on critical dimensions.

In one or more embodiments, the spacer layer may have a thickness in the range of about 3 nm to about 25 nm, or in the range of about 5 nm to about 20 nm, where the thickness of the spacer layer can determine the width of the vertical fins 131.

In one or more embodiments, the sacrificial mandrels can be removed to form a plurality of free-standing spacers, where the spacers may have a first pitch controlled by the spacer width and width of the sacrificial mandrels, and a second pitch controlled by the pitch of the sacrificial mandrels, such that the free standing spacers can be shifted closer to or further from a neighboring spacer. The sacrificial mandrels can be removed by a selective isotropic etch that removes the material of the sacrificial mandrels without notably effecting the spacers or hardmask layer 140.

In various embodiments, the pattern of the spacers can be transferred to the hardmask layer 140, by a directional etch to form hardmask caps 141. The portions of the vertical fin layer between the hardmask caps 141 and spacers can be removed by a directional etch, for example, a reactive ion etch or a neutral beam etch (NBE).

In one or more embodiments, one or more vertical fin(s) 131 can be formed from the vertical fin layer 130 using the spacers and/or hardmask caps 141 formed from the hardmask layer 140 as templates. In various embodiments, the spacers may be removed prior to formation of the vertical fins 131, and the hardmask caps 141 may be used to mask the vertical fin layer 130 for etching.

In various embodiments, each of the one or more vertical fin(s) 131 can be formed on a portion of the underlying source/drain layer 120, where the source/drain layer may form a source/drain for one or more of the vertical fin(s) 131.

In one or more embodiments, the vertical fin 131 can be formed on the source/drain layer 120, where the vertical fin 131 can be a strained vertical fin made of a semiconductor material. The vertical fin 131 can have a tensile or compressive strain. In some embodiments, the strain in the vertical fin 131 ranges from 0.3% to 1.5%, although fins with greater or less strain can also be employed.

Figure 4:
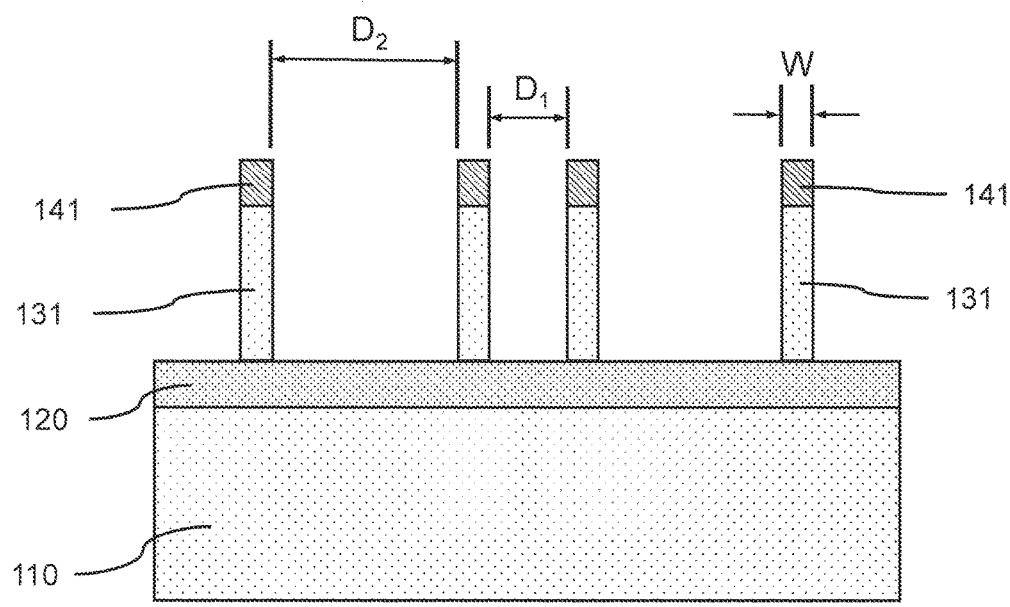
FIG. 4 is a cross-sectional side view showing remaining vertical fins after selective removal of intervening vertical fin(s) by a fin cut process, in accordance with an embodiment of the present invention.

FIG. 4 is a cross-sectional side view showing remaining vertical fins after selective removal of intervening vertical fin(s) by a fin cut process, in accordance with an embodiment of the present invention.

In one or more embodiments, the distances, $D_1$ and $D_2$, between adjacent vertical fins 131 can be further adjusted using a fin cut process to remove certain predetermined vertical fins 131 to form a larger space (e.g., 2×, 3×, 4×, etc. the fin pitch) between vertical fins. In various embodiments, one or more vertical fins 131 can be removed through masking and etching, as would be known in the art for a fin cut process. A remaining vertical fin can have a distance, $D_2$, to a first adjacent fin 131, and a distance, $D_1$, to a second adjacent fin. The distance, $D_2$, can be larger than the distance, $D_1$. The distance, $D_1$, can be the smallest distance between two immediately adjacent fins 131.

In one or more embodiments, the distance, $D_1$, between two adjacent vertical fins can be in the range of about 10 nm to about 40 nm, or in the range of about 10 nm to about 25 nm, although other distances are also contemplated.

In one or more embodiments, the distance, $D_2$, between two adjacent vertical fins can be in the range of about 30 nm to about 100 nm, or in the range of about 40 nm to about 100 nm, or in the range of about 50 nm to about 75 nm, although other distances are also contemplated.

Figure 5:
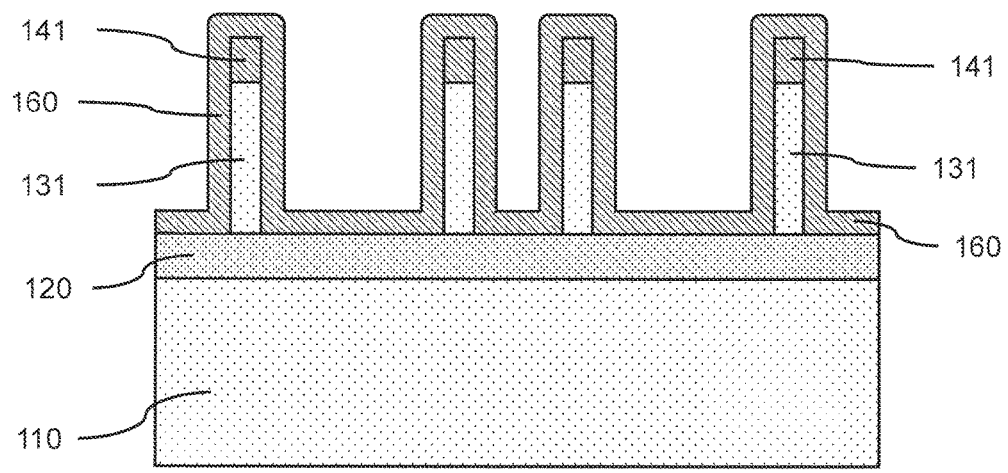
FIG. 5 is a cross-sectional side view showing a protective cover formed on the plurality of vertical fins and hardmask caps, in accordance with an embodiment of the present invention.

FIG. 5 is a cross-sectional side view showing a protective cover formed on the plurality of vertical fins and hardmask caps, in accordance with an embodiment of the present invention.

In one or more embodiments, a protective cover 160 can be formed on the exposed top surface and sides of the hardmask caps 141, and sidewalls and end faces of the one or more vertical fin(s) 131 formed on the source/drain layer 120, where the protective cover 160 can be formed by a blanket deposition. In various embodiments, the protective cover 160 can be formed on the hardmask caps 141, vertical fins 131, and exposed surface of the source/drain layer 120 by a conformal deposition, for example, ALD or PEALD, such that the thickness of the protective cover can be tightly controlled.

In various embodiments, the protective cover 160 can have an essentially uniform thickness (e.g., within process variances/tolerances) on the horizontal and vertical exposed surfaces.

In one or more embodiments, the protective cover 160 can have a thickness, $T_c$, in the range of about 3 nm to about 25 nm, or in the range of about 5 nm to about 20 nm, or about 7 nm to about 15 nm.

In one or more embodiments, the protective cover 160 can be silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof. The material of the protective cover can be the same material as the hardmask caps 141, so the protective cover 160 and hardmask caps 141 can be removed by the same process. In various embodiments, the protective cover 160 and hardmask caps 141 can be different materials, so the protective cover can be selectively removed without removing the hardmask caps 141.

Figure 6:
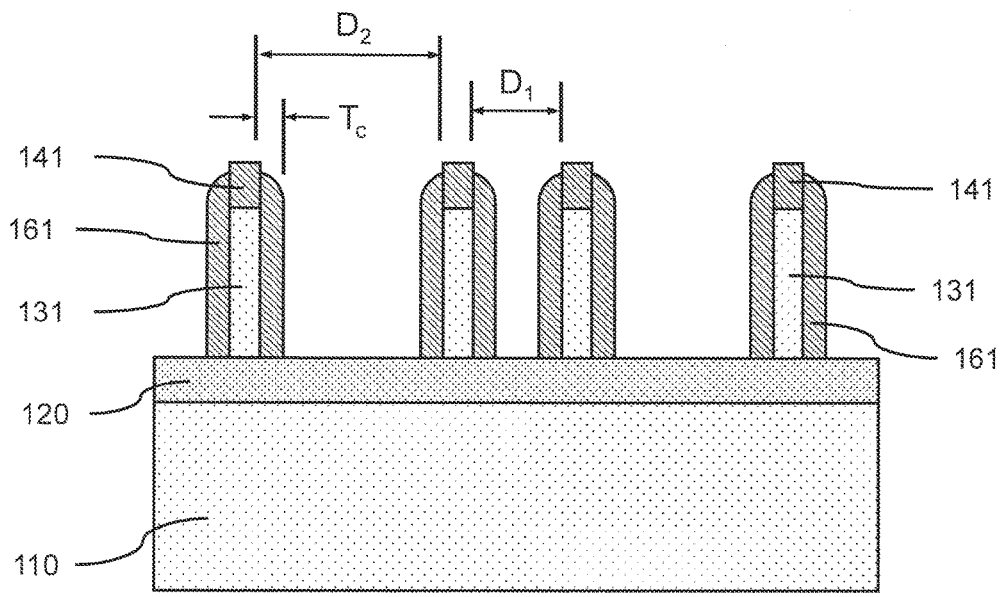
FIG. 6 is a cross-sectional side view showing protective spacers formed on the vertical fins and a portion of the hardmask caps after an etch-back process, in accordance with an embodiment of the present invention.

FIG. 6 is a cross-sectional side view showing protective spacers formed on the vertical fins and a portion of the hardmask caps after an etch-back process, in accordance with an embodiment of the present invention.

In one or more embodiments, the protective cover 160 can be removed from the horizontal surfaces of the hardmask caps 141 and source/drain layer 120, while leaving protective spacers 161 on at least the sidewalls and end faces of the vertical fins 131. A directional etch (e.g., RIE) can be used to remove the portion of the protective cover 160 from the horizontal surfaces.

In various embodiments, the thickness of the protective spacers 161 can define an offset distance from the sidewalls of the vertical fins 131 and fill in a portion of the space between adjacent vertical fins. The thickness of the protective cover 160 can determine the width and position of a sacrificial plug between two closely spaced vertical fins 131.

Figure 7:
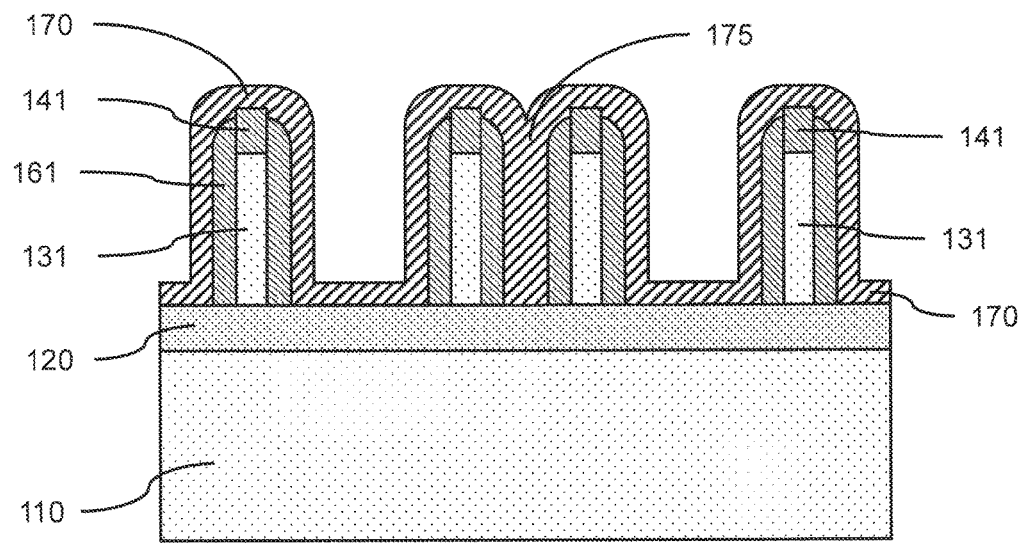
FIG. 7 is a cross-sectional side view showing a pinch-off layer formed on the protective spacers, hardmask caps, and exposed portions of the source/drain layer, in accordance with an embodiment of the present invention.

FIG. 7 is a cross-sectional side view showing a pinch-off layer formed on the protective spacers, hardmask caps, and exposed portions of the source/drain layer, in accordance with an embodiment of the present invention.

In one or more embodiments, a pinch-off layer 170 can be formed on the protective spacers 161 and source/drain layer 120, where the pinch-off layer can be blanket deposited (e.g., CVD, PECVD, LPCVD, ALD, PEALD, etc.).

In one or more embodiments, the thickness of the pinch-off layer 170 can be predetermined to fill the space between two closely spaced (e.g., having distance $D_1$) vertical fins 131 to form a sacrificial plug 175, where two portions of the pinch-off layer 170 can coalesce into the sacrificial plug 175.

In one or more embodiments, the pinch-off layer 170 and sacrificial plug 175 can be silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof. The material of the pinch-off layer 170 and sacrificial plug 175 can be a different material from the protective spacer(s) 161 and hardmask caps 141, so the pinch-off layer 170 and sacrificial plug 175 can be selectively etched back, and can be selectively removed from between two protective spacers.

Figure 8:
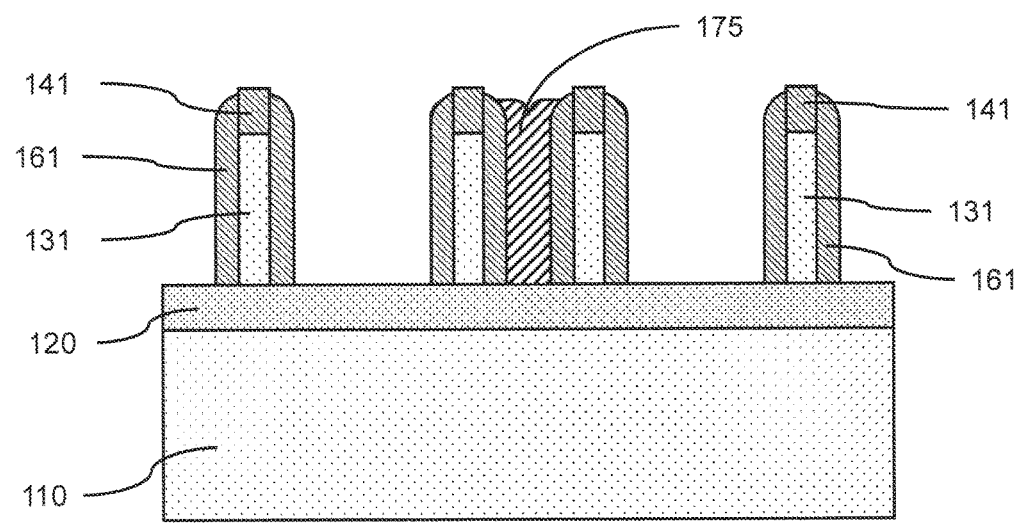
FIG. 8 is a cross-sectional side view showing a sacrificial plug between two protective spacers on vertical fins after etching back portions of the pinch-off layer, in accordance with an embodiment of the present invention.

FIG. 8 is a cross-sectional side view showing a sacrificial plug between two protective spacers on vertical fins after etching back portions of the pinch-off layer, in accordance with an embodiment of the present invention.

In one or more embodiments, the pinch-off layer 170 can be uniformly removed from the exposed surfaces, such that a sacrificial plug 175 remains in the space between two closely spaced vertical fins 131. An isotropic etch (e.g., wet etch) can be used to remove the thickness of the pinch-off layer 170 from the exposed surfaces, where the isotropic etch can be a timed etch. The predetermined thickness of pinch-off layer material can be removed to expose the protective spacers 161 and source/drain layer 120, while only reducing the height of the sacrificial plug 175 between the vertical fins 131 by approximately the material thickness. In various embodiments, the height of the sacrificial plug 175 can be greater than the height of the vertical fins.

Figure 9:
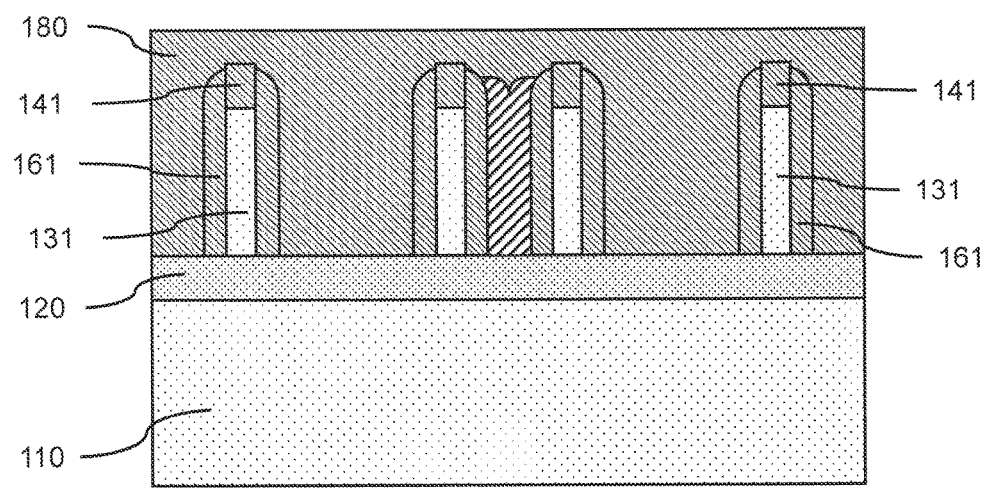
FIG. 9 is a cross-sectional side view showing a filler layer on the protective spacers, hardmask caps, and sacrificial plug, in accordance with an embodiment of the present invention.

FIG. 9 is a cross-sectional side view showing a filler layer on the protective spacers, hardmask caps, and sacrificial plug, in accordance with an embodiment of the present invention.

In one or more embodiments, a filler layer 180 can be formed on the protective spacers 161, hardmask caps 141, sacrificial plug 175, and exposed surfaces of the source/drain layer 120, where the filler layer can be blanket deposited on the exposed surfaces. The filler layer can extend above the top surfaces of the hardmask caps 141, protective spacers 161, and sacrificial plug 175.

In one or more embodiments, the filler layer 180 can be silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof. The material of the filler layer 180 can be a different material from the sacrificial plug 175, such that the sacrificial plug 175 can be selectively removed without removing the filler layer 180. In various embodiments, the filler layer can be the same material as the hardmask caps 141 and protective spacers 161, so the filler layer 180, hardmask caps 141, and protective spacers 161 can be removed at the same time with the same isotropic etch.

Figure 10:
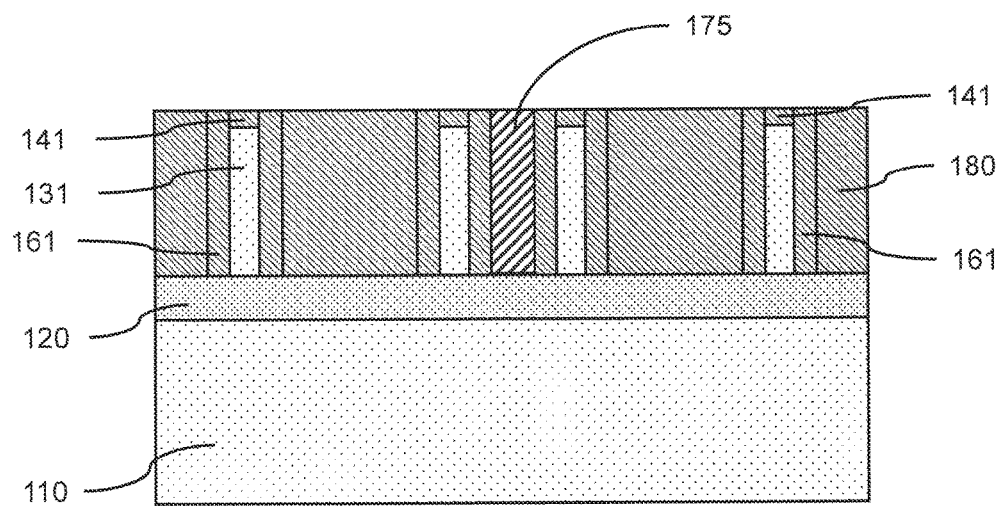
FIG. 10 is a cross-sectional side view showing the filler layer and sacrificial plug after a chemical-mechanical polishing (CMP), in accordance with an embodiment of the present invention.

FIG. 10 is a cross-sectional side view showing the filler layer and sacrificial plug after a chemical-mechanical polishing (CMP), in accordance with an embodiment of the present invention.

In one or more embodiments, the height of the excess filler layer material, and upper portions of the hardmask caps 141, protective spacers 161, and sacrificial plug 175 can be reduced using a CMP to provide a smooth, flat surface. In various embodiments, the portion of the hardmask caps 141 that is removed is less than the original height of the hardmask caps 141, such that the tops of the vertical fins 131 are still covered by at least a portion of the hardmask caps 141. The original height of the sacrificial plug 175 can be greater than the combined height of the hardmask cap 141 and vertical fin 131 after the CMP, so a crease or divot formed during deposition of the sacrificial plug 175 can be removed by the CMP. The top surface of the sacrificial plug can be exposed after the CMP.

In one or more embodiments, a plurality of vertical fins 131 can be on the source/drain layer 120 with a protective spacer on each sidewall of each vertical fin 131. A sacrificial plug 175 can be between and in contact with at least two opposing protective spacers 161 on adjacent vertical fins 131, and a filler layer can be in the space between opposing protective spacers 161 not filled by a sacrificial plug 175. In various embodiments, the sacrificial plug 175 can be directly on the source/drain layer 120 and in direct contact with two opposing protective spacers 161.

Figure 11:
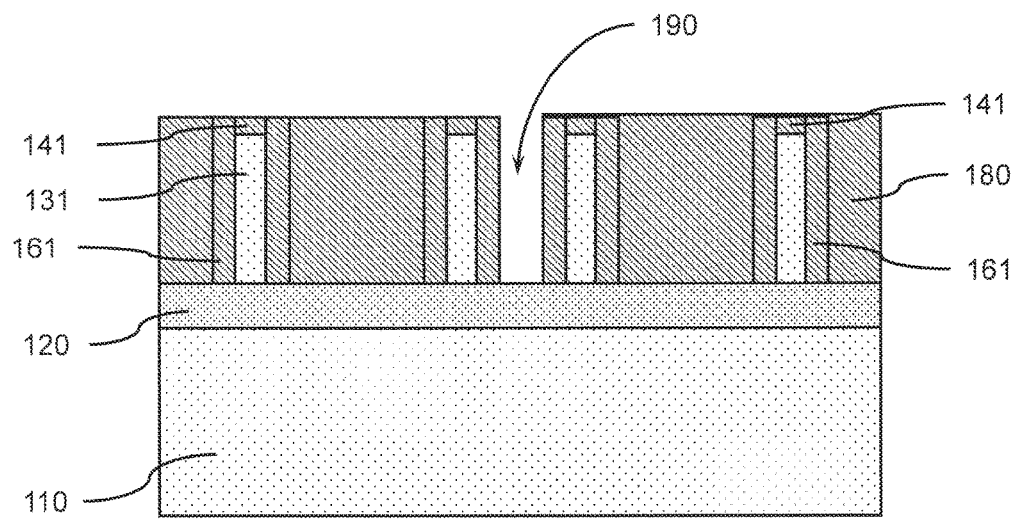
FIG. 11 is a cross-sectional side view showing an isolation region trench formed between two opposing protective spacers on adjacent vertical fins by removal of the sacrificial plug, in accordance with an embodiment of the present invention.

FIG. 11 is a cross-sectional side view showing an isolation region trench formed between two opposing protective spacers on adjacent vertical fins by removal of the sacrificial plug, in accordance with an embodiment of the present invention.

In one or more embodiments, the sacrificial plug 175 can be removed, where the sacrificial plug 175 can be removed using a selective etch. The selective etch can be a directional etch (e.g., RIE) or a non-directional isotropic etch (e.g., wet etch). Removal of the sacrificial plug 175 can form an isolation region trench 190 between two protective spacers 161, and expose a portion of the underlying source/drain layer 120 between two closely spaced vertical fins 131. In various embodiments, the isolation region trench can be self-aligned with the two closely spaced vertical fins 131, and off-set from the vertical fins by the thickness of the opposing protective spacers 161.

Figure 12:
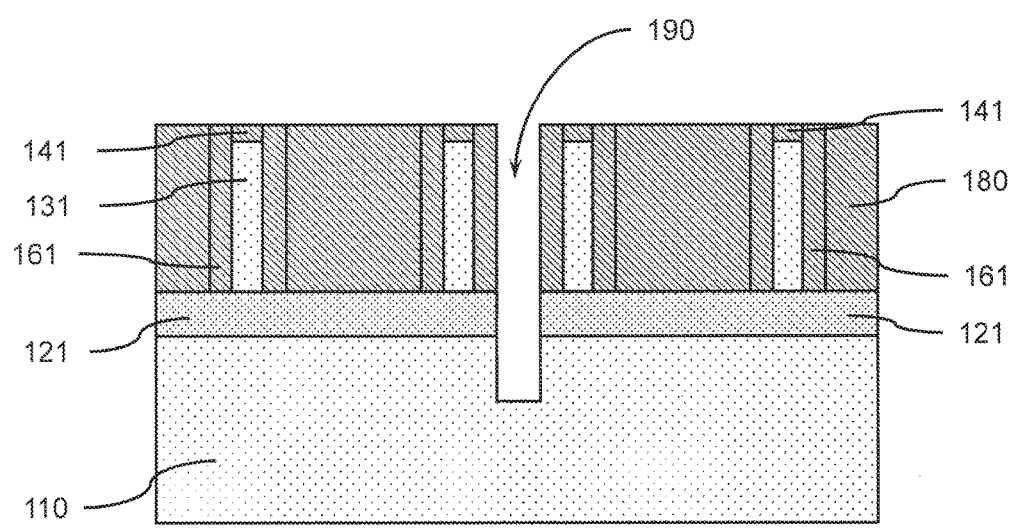
FIG. 12 is a cross-sectional side view showing the isolation region trench extended through the source/drain layer and into a portion of the underlying substrate, in accordance with an embodiment of the present invention.

FIG. 12 is a cross-sectional side view showing the isolation region trench extended through the source/drain layer and into a portion of the underlying substrate, in accordance with an embodiment of the present invention.

In one or more embodiments, the exposed portion of the source/drain layer 120 can be removed to extend the isolation region trench 190 through the source/drain layer 120 at least to the substrate 110. Removal of the portion of the source/drain layer at the bottom of the isolation region trench 190 can separate the source/drain layer into two segments 121. The exposed portion of the source/drain layer 120 can be removed using a selective, directional etch, for example, a selective RIE.

In one or more embodiments, a portion of the substrate 110 can be removed from the bottom of the isolation region trench 190 to extent the isolation region trench 190 into the substrate 110. Extension of the isolation region trench 190 into the substrate 110 can further electrically isolate two FinFET device subsequently formed on the source/drain layer.

In one or more embodiments, the isolation region trench 190 can have a width in the range of about 10 nm to about 40 nm, or in the range of about 20 nm to about 30 nm, although other widths are also contemplated.

In one or more embodiments, the isolation region trench 190 can extend into the substrate 110 by a distance in the range of about 20 nm to about 70 nm, or in the range of about 30 nm to about 50 nm, although other depths are also contemplated.

Figure 13:
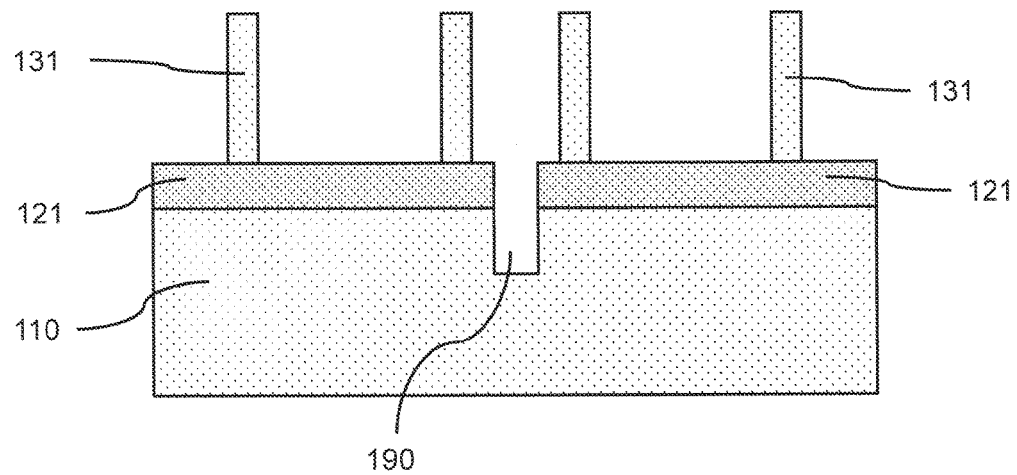
FIG. 13 is a cross-sectional side view showing exposed vertical fins after removal of the filler layer, protective spacers, and hardmask caps, in accordance with an embodiment of the present invention.

FIG. 13 is a cross-sectional side view showing exposed vertical fins after removal of the filler layer, protective spacers, and hardmask caps, in accordance with an embodiment of the present invention.

In one or more embodiments, the filler layer 180, protective spacers 161, and hardmask caps 141 can be removed to expose the vertical fins 131 and source/drain layer 120. In various embodiments, where the filler layer 180, protective spacers 161, and hardmask caps 141 are all the same material, the filler layer, protective spacers, and hardmask caps can be removed at the same time using a single selective etching process. In embodiments, in which the filler layer 180, protective spacers 161, and hardmask caps 141 are different materials, multiple selective etching processes can be used to avoid damage to the vertical fins, substrate, and source/drain layer segments 121.

In one or more embodiments, the hardmask caps 141 can be a different material from the filler layer 180 and protective spacers 161, so the hardmask caps 141 remain on the tops of the vertical fins 131 after removal of the filler layer and protective spacers.

In a non-limiting exemplary embodiment, the filler layer 180 and protective spacers 161 can be silicon dioxide ($SiO_2$), the sacrificial plug 175 can be silicon nitride ($Si_3N_4$), and the hardmask caps 141 can be silicon borocarbide (SiBC). A remote plasma assisted SiConi™ etch provides the simultaneous exposure of a substrate to $H_2$, $NF_3$ and $NH_3$ plasma by-products to selectively remove silicon oxide materials. A remote $O_2/N_2$ discharge with limited $CF_4/NF_3$ can be used to selectively remove $Si_3N_4$ over $SiO_2$ and Si. An $SF_6+O_2$ etch can remove the silicon borocarbide (SiBC).

In another non-limiting exemplary embodiment, the hardmask caps 141 can be silicon dioxide ($SiO_2$) and the filler layer 180 and protective spacers 161 can be silicon nitride ($Si_3N_4$), where the pinch-off layer 170 and sacrificial plug 175 are a different material from the protective spacer(s) 161 and hardmask caps 141, so the pinch-off layer 170 and sacrificial plug 175 can be selectively etched back.

Figure 14:
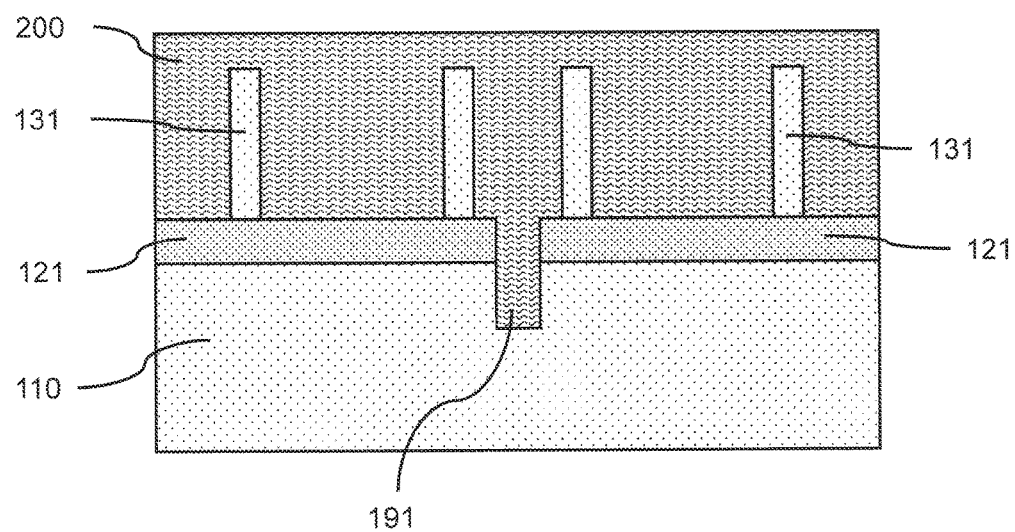
FIG. 14 is a cross-sectional side view showing a dummy layer covering the vertical fins, source/drain layer segments, and forming a fill in the isolation region trench, in accordance with an embodiment of the present invention.

FIG. 14 is a cross-sectional side view showing a dummy layer covering the vertical fins, source/drain layer segments, and forming a fill in the isolation region trench, in accordance with an embodiment of the present invention.

In one or more embodiments, a dummy layer 200 can be formed on and around the vertical fins 131 and source/drain segments 121, where the dummy layer can be an interlayer dielectric (ILD) layer or organic planarization layer (OPL). The dummy layer 200 can be blanket deposited on the exposed surfaces of the source/drain segments 121 and vertical fins 131, and form a fill 191 at and below source/drain segments 121 in the isolation region trench 190.

In various embodiments, the organic planarization layer (OPL) can be a polyacrylate resin, epoxy resin, phenol resin, polyamide resin, polyimide resin, unsaturated polyester resin, polyphenylenether resin, polyphenylenesulfide resin, or benzocyclobutene (BCB), that can be patterned and developed on the source/drain layer segments 121 and vertical fins 131. The OPL can be spun onto the surface, and a CMP can be used to provide a smooth, flat surface.

In various embodiments, the ILD layer can be silicon oxide (SiO), a low-K insulating dielectric, silicon oxynitride (SiON), carbon doped silicon oxide, fluorine doped silicon oxide, boron carbon nitride (BCN), hydrogen silsesquioxane polymer (HSQ), methyl silsesquioxane polymer (MSQ), methyl doped silica or $SiO_x(CH_3)_y$, or $SiC_xO_yH_z$, organosilicate glass (SiCOH), porous SiCOH, and/or combinations thereof. Excess ILD material may be etched back or removed by chemical-mechanical polishing (CMP). A chemical-mechanical polishing can be used to removed excess ILD material and provide a smooth flat surface.

Figure 15:
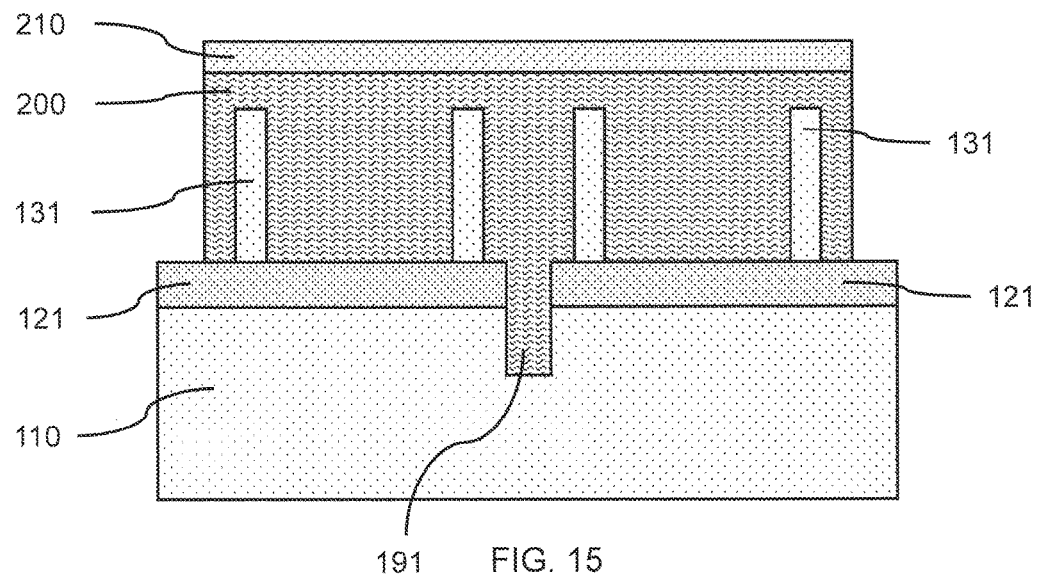
FIG. 15 is a cross-sectional side view a showing masking layer on an ILD layer, in accordance with an embodiment of the present invention.

FIG. 15 is a cross-sectional side view showing a masking layer on an ILD layer, in accordance with an embodiment of the present invention.

A masking layer 210 can be formed on the ILD layer, where the masking layer can by a lithographic resist material that can be patterned and developed, as would be known in the art. A masking layer 210 may not be used on an OPL, since the OPL can be patterned and developed.

In one or more embodiments, the masking layer 210 can be patterned and developed to expose portions of an underlying ILD layer, where the exposed portions of the ILD layer can be removed to expose the source/drain segments 121.

In various embodiments, the portion of the masking layer 210 removed can expose the underlying ILD layer at a location on an opposite side of at least one vertical fin 131 intervening with the filled isolation region trench 190. In various embodiments, two or more intervening vertical fins 131 can be between the filled isolation region trench 190 and the exposed portion of the ILD layer.

In one or more embodiments, the exposed portion of the ILD layer 200 can be removed to expose the underlying portion of the source/drain segment 121. Portions of the ILD layer 200 can be on either or both sides of the filled isolation region trench 190 to expose the underlying portions of the source/drain segments 121.

Figure 16:
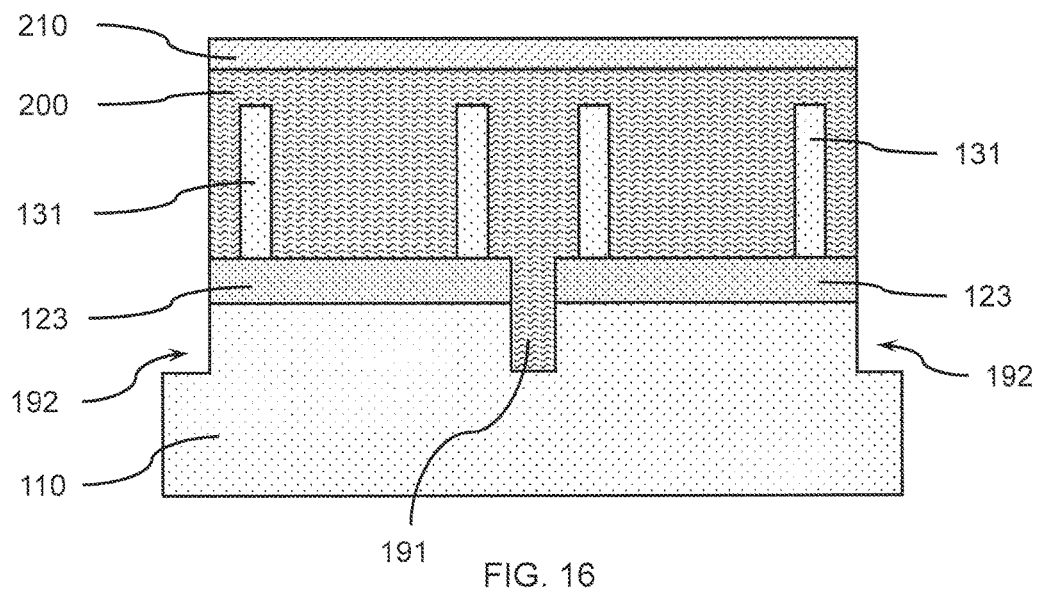
FIG. 16 is a cross-sectional side view showing isolation region trenches formed into the substrate on both sides of the initial isolation region trench, in accordance with an embodiment of the present invention.

FIG. 16 is a cross-sectional side view showing isolation region trenches formed into the substrate on both sides of the initial isolation region trench, in accordance with an embodiment of the present invention.

In one or more embodiments, an isolation region trench 192 can be formed on either or both sides of the filled isolation region trench 190, where one or more vertical fin(s) 131 are between the filled isolation region trench 190 and formed isolation region trench(es) 192. The isolation region trenches 192 can be formed using a selective etch (e.g., RIE). The isolation region trenches 192 can extend through the source/drain segment 121 into the substrate 110 by a distance in the range of about 20 nm to about 70 nm, or in the range of about 30 nm to about 50 nm, although other depths are also contemplated. In various embodiments, the isolation region trenches 192 can be the same or different depth as the isolation region trench 190.

In one or more embodiments, the isolation region trenches 192 can separate the source/drain segments 121 into individual source/drains 123 underneath one or more vertical fins 131, where the individual bottom source/drains 123 can each form a bottom source/drain for a FinFET device.

Figure 17:
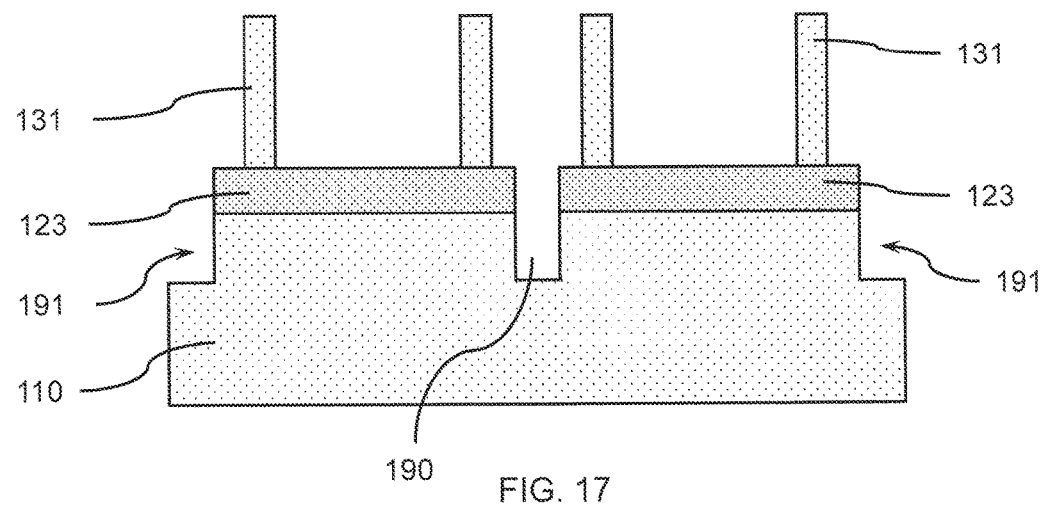
FIG. 17 is a cross-sectional side view showing the isolation region trenches and vertical fins after removal of the ILD layer and masking layer or the OPL, in accordance with an embodiment of the present invention.

FIG. 17 is a cross-sectional side view showing the isolation region trenches and vertical fins after removal of the ILD layer and masking layer or the OPL, in accordance with an embodiment of the present invention.

In one or more embodiments, the dummy layer 200 and masking layer 210 can be removed to expose the vertical fins 131 and newly formed isolation region trenches 192, and to reopen the isolation region trench 190. The OPL or ILD layer 200 and masking layer 210 can be removed using techniques known in the art (e.g., etching, stripping, ashing, etc.).

Figure 18:
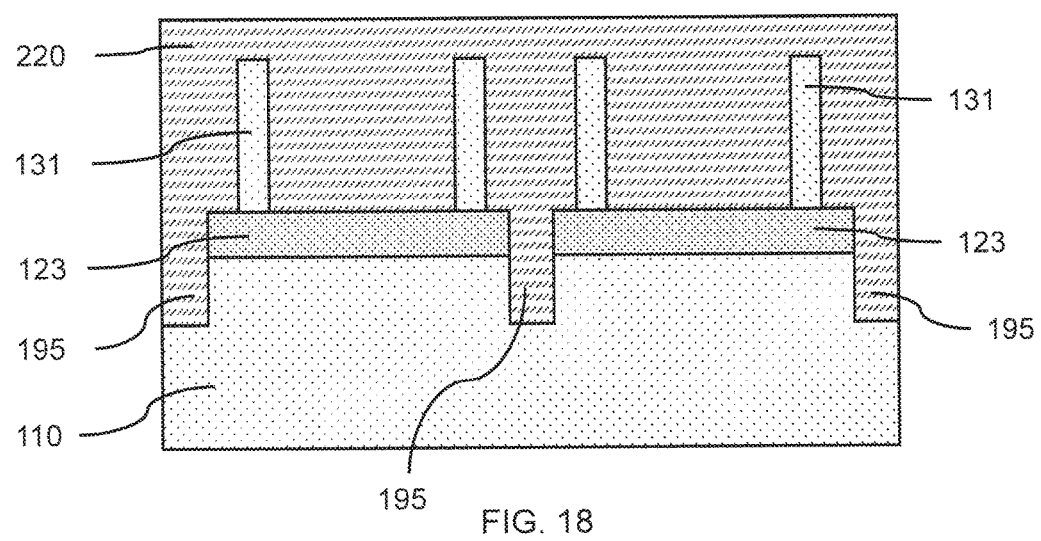
FIG. 18 is a cross-sectional side view showing a trench fill layer on the vertical fins and bottom source/drains, and in the isolation region trenches, in accordance with an embodiment of the present invention.

FIG. 18 is a cross-sectional side view showing a trench fill layer on the vertical fins and bottom source/drains, and in the isolation region trenches, in accordance with an embodiment of the present invention.

In one or more embodiments, a trench fill layer 220 can be formed on the vertical fins 121 and bottom source/drains 123, and in the isolation region trenches 190, 192, where the trench fill layer can be blanket deposited. The trench fill layer 220 can extend above the top surfaces of the vertical fins 131.

In one or more embodiments, the trench fill layer 220 can be an insulating dielectric material, including but not limited to, silicon oxide (SiO), silicon oxynitride (SiON), a low-K dielectric, or combinations thereof. The low-K dielectric can be silicon carbon doped silicon oxide (SiOC), fluorine doped silicon oxide (SiO:F), boron carbon nitride (BCN), hydrogen silsesquioxane polymer (HSQ), methyl silsesquioxane polymer (MSQ), methyl doped silica or $SiO_x(CH_3)_y$ or $SiC_xO_yH_z$, organosilicate glass (SiCOH), porous SiCOH, and/or combinations thereof.

In one or more embodiments, a trench fill layer 220 can be formed in the trenches 190. The trench fill layer 220 can be formed by a conformal deposition (e.g., ALD), a directional deposition (e.g., gas cluster ion beam (GCIB)) or a combination thereof to avoid pinch-off and void formation. In various embodiments, the trench fill can be formed by atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), in-situ radical assisted deposition, low temperature oxide deposition (LTO), ozone/TEOS deposition, limited reaction processing CVD (LRP-CVD), spin-on-coating, ion beam deposition, electron beam deposition, laser assisted deposition, chemical solution deposition, or any combination of the methods.

Figure 19:
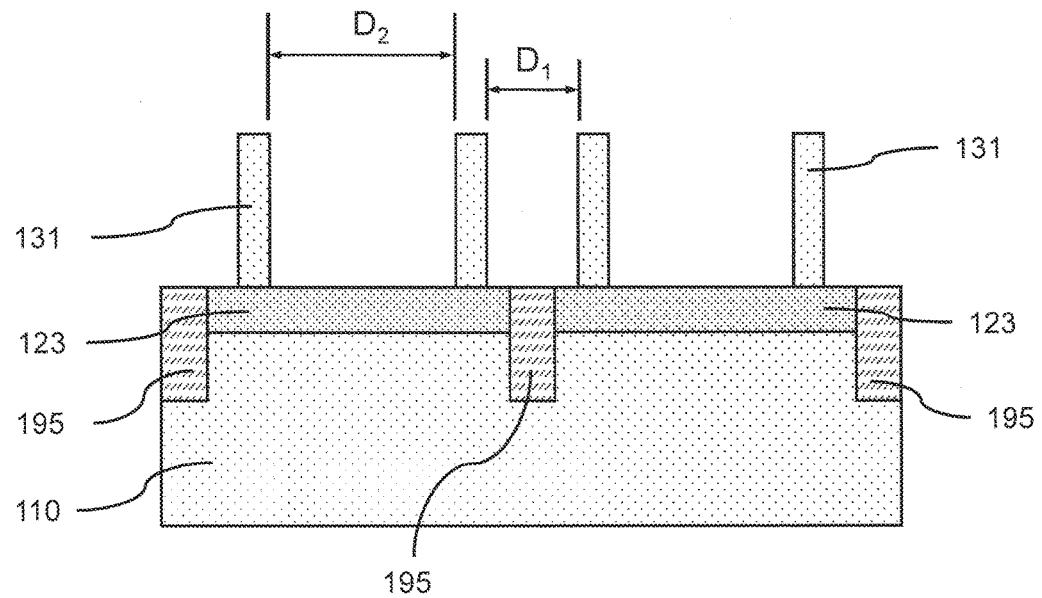
FIG. 19 is a cross-sectional side view showing filled shallow trench isolation regions in the substrate adjacent to bottom source/drains, in accordance with an embodiment of the present invention.

FIG. 19 is a cross-sectional side view showing filled shallow trench isolation regions in the substrate adjacent to bottom source/drains, in accordance with an embodiment of the present invention.

In one or more embodiments, the height of the trench fill layer 220 can be reduced, for example, by an etch-back process (e.g., RIE). The trench fill layer 220 can be etched back to the surface of the bottom source/drains 123, to form a shallow trench isolation (STI) region 195 in each isolation region trench 190, 192. The shallow trench isolation region(s) 195 can electrically isolate the bottom source/drains, and a FinFET device formed on the bottom source/drain from neighboring FinFET devices.

Figure 20:
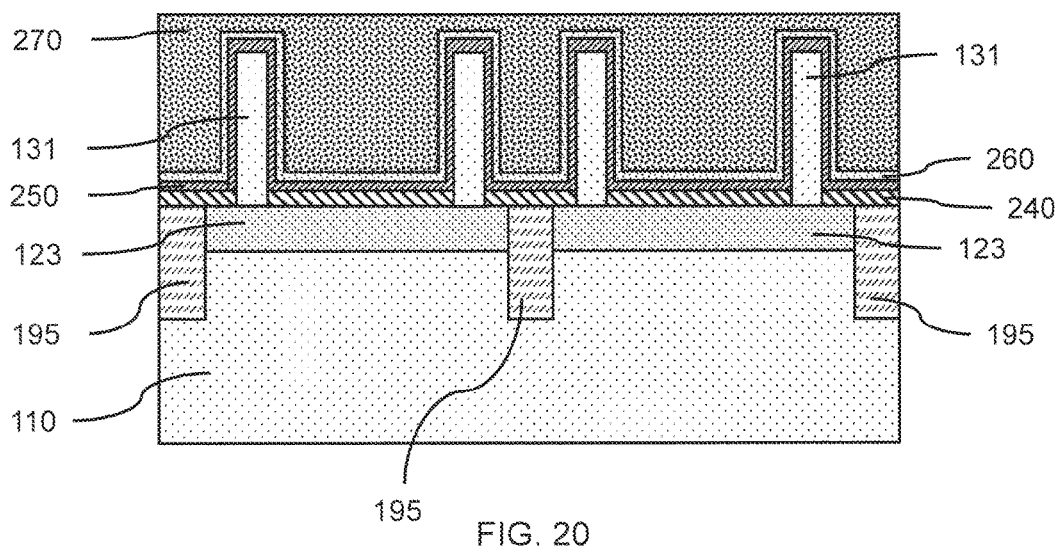
FIG. 20 is a cross-sectional side view showing a bottom spacer and a gate structure formed on each of the vertical fins, bottom source/drains, and shallow trench isolation regions, in accordance with an embodiment of the present invention.

FIG. 20 is a cross-sectional side view showing a bottom spacer and a gate structure formed on each of the vertical fins, bottom source/drains, and shallow trench isolation regions, in accordance with an embodiment of the present invention.

In one or more embodiments, a bottom spacer layer 240 can be formed on the bottom source/drains 123 and shallow trench isolation regions 195, for example, by a directional deposition (e.g., gas cluster ion beam (GCIB)). In various embodiments, the bottom spacer layer 240 can be formed by high density plasma (HDP) deposition followed by a conformal etch, where the HDP can be partially directional to provide a thicker bottom spacer layer 240 on surfaces substantially perpendicular (e.g., bottom source/drain surface) to the incident beam and a thinner bottom spacer layer 240 on surfaces substantially parallel to the incident beam (e.g., vertical sidewalls). The conformal etch can remove portions of the bottom spacer layer 240 on the sidewalls, leaving the bottom spacer layer 240 with a reduced thickness on the horizontal surfaces.

In one or more embodiments, the bottom spacer layer 240 can be silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof.

In various embodiments, bottom spacer layer material that becomes deposited on the sidewalls of the vertical fins 131 can be etched back, for example, using an isotropic etch.

In one or more embodiments, a gate structure can be formed on the bottom spacer layer 240, where the gate structure can include a gate dielectric layer 250 formed on at least a portion of the exposed surfaces of the vertical fin 131 and a conductive gate electrode including a conductive gate fill layer 270 and optionally a work function layer 260 between the gate dielectric layer 250 and the conductive gate fill layer 270. In some embodiments, the gate structure can further include a dielectric cap (not shown) on top of the conductive gate fill layer 270. In various embodiments, the gate structure can be formed by self-aligned double patterning (SADP) or self-aligned quadruple patterning (SAQP) techniques.

In various embodiments, the gate structure may be formed by a 'gate first' process, in which layers for the gate dielectric layer 250, work function layer 260, and conductive gate fill layer 270 can be formed on one or more vertical fin(s) 131. A lithography mask (e.g., a photoresist layer and/or hardmask) can be formed on the conductive gate fill layer over the one or more vertical fin(s) 131, and patterned to expose portions of the conductive gate fill layer 270, work function layer 260, and gate dielectric layer 250 for subsequent removal. An etching process (e.g., RIE) can be utilized to remove the conductive gate fill layer, work function layer, and gate dielectric layer to expose portions of the bottom spacer layer 240 and/or bottom source/drain 123.

In one or more embodiments, a gate structure can be formed by a 'gate-last' process. In a gate-last process, a dummy gate structure (not shown) is formed first, followed by the gate spacer, source/drain, and interlevel dielectric. The dummy gate is then removed and replaced by the actual gate structure. In various embodiments, the gate dielectric layer 250 can be formed on the exposed surfaces within the void space formed by a gate spacer after removal of the dummy gate, and on the exposed surfaces of the vertical fin 131 within the void space. A work function layer 260 can be formed on the gate dielectric layer 250. A conductive gate fill layer 270 can be formed in the remaining void space after formation of the gate dielectric layer and work function layer.

In various embodiments, the gate dielectric layer 250 can include silicon oxide (SiO), silicon nitride (SiN), silicon oxynitride (SiON), boron nitride (BN), high-k dielectric materials, or a combination of these materials. Examples of high-k dielectric materials include, but are not limited to, metal oxides such as hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material can further include dopants such as lanthanum (La) and aluminum (Al).

In various embodiments, the conductive gate fill layer 270 material can include doped polycrystalline silicon (p-Si) or amorphous silicon (a-Si), germanium (Ge), silicon-germanium (SiGe), a metal (e.g., tungsten, titanium, tantalum, ruthenium, zirconium, cobalt, copper, aluminum, lead, platinum, tin, silver, or gold), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO), cobalt silicide (CoSi), or nickel silicide (NiSi)), carbon nanotube(s) (CNTs), conductive carbon, graphene, or any suitable combination of these materials. The conductive gate fill layer material can further include dopants that are incorporated during or after formation (e.g., deposition).

In various embodiments, the gate structure (e.g., gate stack) can further include a work function setting layer. The work function layer 260 can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

In various embodiments, the lithography mask can be removed after formation (e.g., etching) of the gate structures. In various embodiments, a gate insulator cap layer can optionally be formed on the conductive gate fill layer 270, as a protective gate cap.

In one or more embodiments, the conductive gate fill layer 270 can extend above the top surfaces of the work function layer 260 and/or gate dielectric layer 250 on the top surfaces of the vertical fins 131. The conductive gate fill layer 270 can be etched back or a CMP can be used to reduce the height of the conductive gate fill layer 270.

Figure 21:
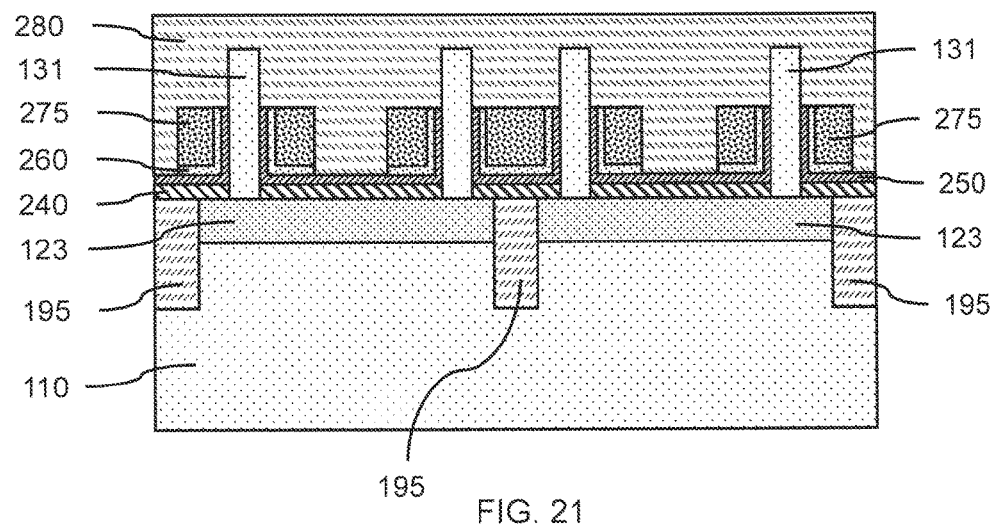
FIG. 21 is a cross-sectional side view showing an ILD layer on configured gate structures, in accordance with an embodiment of the present invention.

FIG. 21 is a cross-sectional side view showing an ILD layer on configured gate structures, in accordance with an embodiment of the present invention.

In one or more embodiments, a mask can be formed on the conductive gate fill layer 270 and patterned to expose portions of the conductive gate fill layer to be removed. Portions of the conductive gate fill layer 270 can be removed to separate the conductive gate fill layer 270 into separate conductive gates 275 on different sections of the work function layer 260 and gate dielectric layer 250. In various embodiments, portions of the work function layer can be removed to separate the gate electrodes into two separate gate electrodes on different vertical fins 131.

In one or more embodiments, the heights of the conductive gate fill layer 270, work function layer 260, and gate dielectric layer 250 can be reduced, for example, by an etch-back process (e.g., RIE) to define the gate length on each of the vertical fins 131. A portion of the vertical fins 131 can extend above the top surface of the gate structures to provide space for formation of a top spacer layer and a top source/drain on each of the vertical fins 131.

In one or more embodiments, an ILD layer 280 can be formed on the conductive gate fill layer 270, work function layer 260, gate dielectric layer 250, and vertical fins 131, where the ILD layer 280 can be blanket deposited to fill the spaces between the separated gate electrodes and vertical fins. The ILD layer 280 can electrically isolate each gate electrode from the adjacent gate electrodes.

Figure 22:
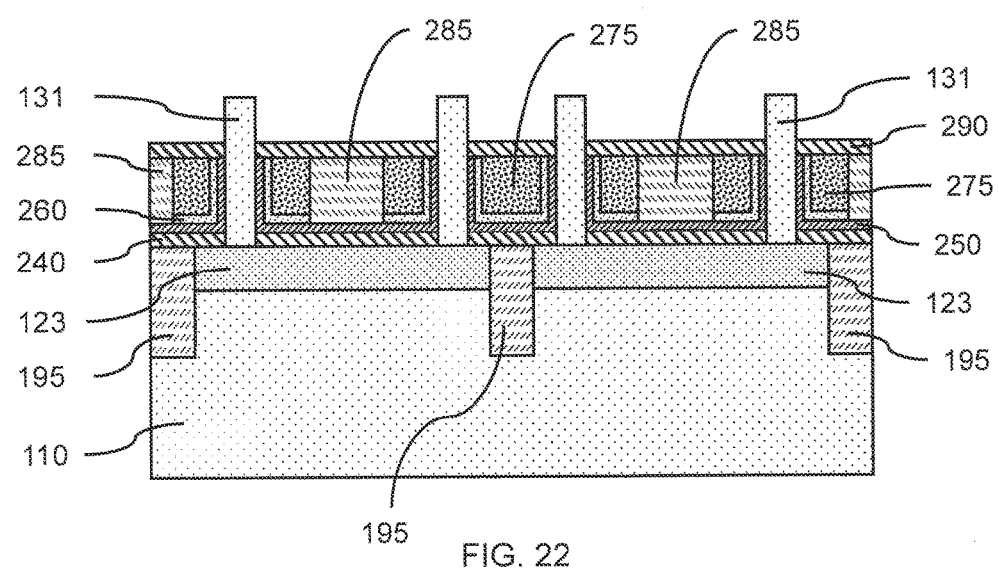
FIG. 22 is a cross-sectional side view showing a top spacer layer on the ILD layer and vertical fins, in accordance with an embodiment of the present invention.

FIG. 22 is a cross-sectional side view showing a top spacer layer on the ILD layer and vertical fins, in accordance with an embodiment of the present invention.

In one or more embodiments, the ILD layer 280 can be partially removed to reduce the height of the ILD layer 280 to the top surface of the conductive gate fill layer 270, work function layer 260, and gate dielectric layer 250 to expose an upper portion of the vertical fins 131. A portion of the ILD layer 280 can remain in the space between the gate electrodes to form an ILD plug 285 adjacent to a conductive gate 275.

In one or more embodiments, a top spacer layer 290 can be formed on the ILD plugs 285, where the can be formed by a conformal deposition (e.g., ALD), a directional deposition (e.g., gas cluster ion beam (GCIB)) or a combination thereof. In various embodiments, top spacer layer material that becomes deposited on the sidewalls of the vertical fins 131 can be etched back, for example, by an isotropic etch or RIE.

In one or more embodiments, a top spacer layer 290 can be silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof.

In various embodiments, an upper portion of the vertical fins 131 extends above the top surface of the top spacer layer, so a portion of the vertical fins is exposed for formation of a top source/drain.

Figure 23:
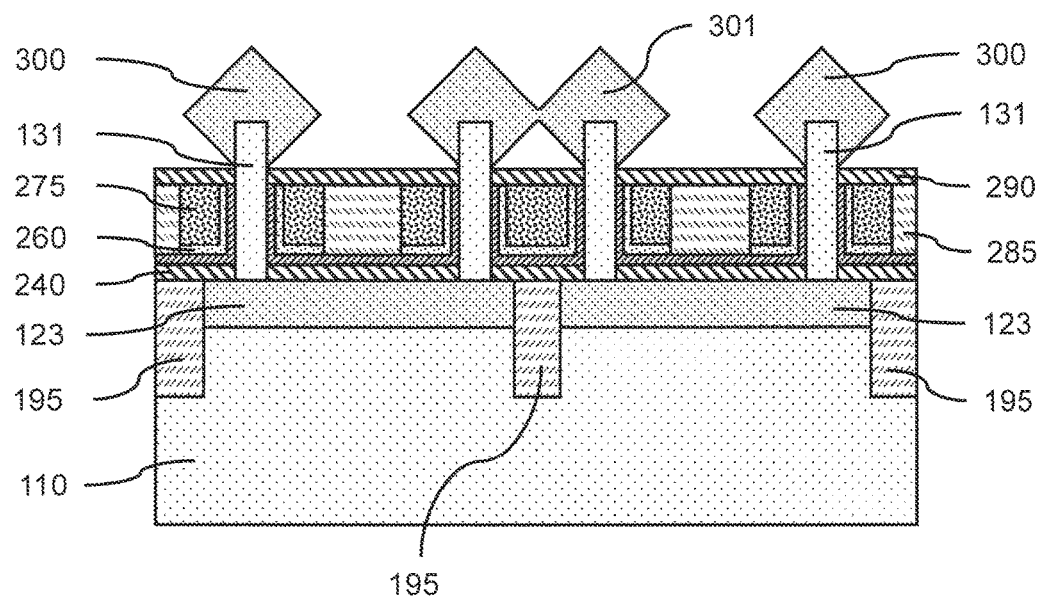
FIG. 23 is a cross-sectional side view showing top source/drains formed on the upper portion of the vertical fins, in accordance with an embodiment of the present invention.

FIG. 23 is a cross-sectional side view showing top source/drains formed on the upper portion of the vertical fins, in accordance with an embodiment of the present invention.

In one or more embodiments, top source/drains 300 can be formed on each of the vertical fin 131, where the top source/drains 300 can be epitaxially grown on the exposed surfaces of the vertical fins 131 above the top spacer layer 290. In various embodiments, the source/drains 300 can be in-situ doped (where doping and epitaxy growth are performed at the same time), and/or ex-situ doped (where doping occurs before and/or after epitaxy). Dopants can be incorporated during epitaxy (e.g., by in-situ epitaxy) or by any other suitable doping techniques, including but not limited to, ion implantation, gas phase doping, plasma doping, plasma immersion ion implantation, cluster doping, infusion doping, liquid phase doping, solid phase doping, etc. In various embodiments, the source/drains 300 can be doped to form n-type or p-type source/drains to fabricate NFETs or PFETs, where the doping of the top source/drains 300 can be the same as the bottom source/drains 123.

In one or more embodiments, the epitaxial source/drains 300 can be silicon, silicon germanium, germanium, carbon doped silicon, carbon doped silicon germanium, or any other suitable semiconductor material. The source/drains 300 can be single crystal grown on single crystal vertical fins 131.

In a non-limiting exemplary embodiment, the source/drain 300 can be epitaxially grown on the exposed surfaces of a strained, crystalline Si or SiGe vertical fin 131 having a predetermined crystal orientation, where the source/drain(s) 300 can be formed on the three exposed surfaces of the vertical fin 131.

In one or more embodiments, the epitaxially grown top source/drains 300 can have a diamond shape, a rectangular shape, as well as other shapes depending upon the crystal faces of the vertical fin 131 that the top source/drain is grown on. In various embodiments, the source/drains 310 can be grown until the top source/drains reach a predetermined size, where the top source/drains on the vertical fins 131 that are further apart by distance, $D_2$, remain separate unmerged top source/drains 300, and the top source/drains on the closer vertical fins that are separated by distance, $D_1$, coalesce to form merged top source/drains 301. The predetermined size of at least two adjacent top source/drains 300 can be greater than the distance between the two adjacent vertical fins 131 to form a merged top source/drain 301, where each top source/drain spans at least half the distance between the vertical fins 131.

The portion of the vertical fin 131 between the top source/drain 300 and bottom source/drain 123 can form a channel of a FinFET, where the current would flow perpendicular to the plane of the substrate 110 from one source/drain to another (e.g., a vertical FinFET) passed the gate structure. The gate structure can control the amount of current flowing through the channel of the FinFET device.

Figure 24:
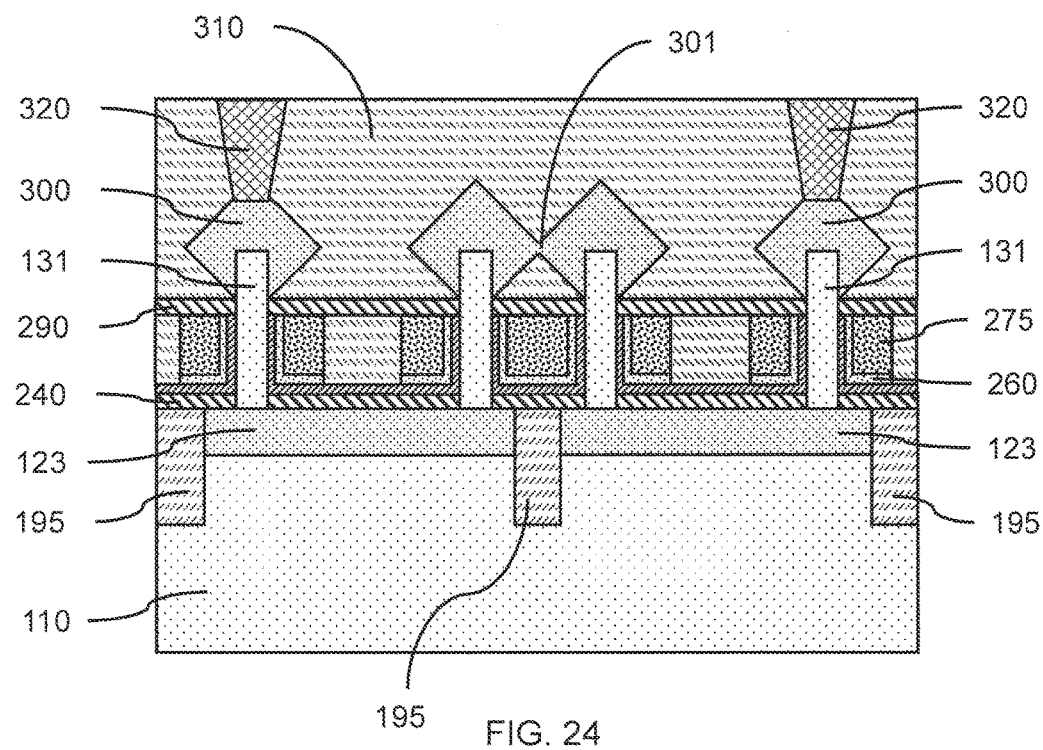
FIG. 24 is a cross-sectional side view showing a second ILD layer formed on the top source/drains and top spacer layer, in accordance with an embodiment of the present invention.

FIG. 24 is a cross-sectional side view showing a second ILD layer formed on the top source/drains and top spacer layer, in accordance with an embodiment of the present invention.

In one or more embodiments, a second interlayer dielectric (ILD) layer 310 can be formed on and around the top source/drain 300 and on the top spacer layer 290, where the ILD layer 310 can be blanket deposited on the exposed surfaces.

In various embodiments, the ILD layer 310 can be silicon oxide (SiO), a low-K insulating dielectric, silicon oxynitride (SiON), carbon doped silicon oxide, fluorine doped silicon oxide, boron carbon nitride (BCN), hydrogen silsesquioxane polymer (HSQ), methyl silsesquioxane polymer (MSQ), methyl doped silica or $SiO_x(CH_3)_y$, or $SiC_xO_yH_z$, organosilicate glass (SiCOH), porous SiCOH, and/or combinations thereof. Excess ILD material may be etched back and/or removed by chemical-mechanical polishing (CMP) to provide a smooth flat surface.

In one or more embodiments, a masking layer can be formed on the ILD layer 310, and patterned to expose portions of the ILD layer, as would be known in the art. The exposed portions of the ILD layer 310 can be removed, for example, by a directional etch (e.g., RIE) to form openings down to the top source/drains 300, and bottom source/drains 123. Removal of the portions of the ILD layer 310 can form vias for electrical contacts to the FinFET device components.

In various embodiments, the vias in the ILD layer 310 can be aligned with the unmerged top source/drains 300, and conducting material can be deposited in the vias to form the electrical contacts 320. In various embodiments, vias are not formed to the merged top source/drain 301. Instead, the merged top source/drain 301 creates an electrical connection between the two neighboring vertical fins 131 and the FinFET devices that they form a part of. A chemical-mechanical polishing can be conducted to remove excess electrical contact material and provide a smooth, flat surface.

The electrical contacts 320 can be a conductive material, including but not limited to tungsten, titanium, tantalum, ruthenium, zirconium, cobalt, tantalum nitride, titanium nitride, cobalt silicide, nickel silicide, carbon nanotube, conductive carbon, graphene, or any suitable combination of these materials. The conductive material can further include dopants that are incorporated during or after deposition.

In various embodiments, the FinFET device can have a strained channel formed by the strained vertical fin 131 and a self-aligned isolation region (e.g., shallow trench isolation (STI)) 195 formed by the trench fill 220 adjacent to the semiconductor device and in the substrate. An active gate structure can be over and around the FinFET channel, and dummy gate structures can be on the ends of the vertical fin.

In one or more embodiments, an adjoined pair of vertical fin devices (e.g., FinFETs) can be formed on a substrate, where a first bottom source/drain 123 is separated from a second bottom source/drain 123 by a shallow trench isolation (STI) region 195 formed into the substrate 110. In various embodiments, at least two vertical fins 131 can be formed on each of the bottom source/drains 123, where the vertical fins on the same bottom source/drain can be separated by a distance, $D_2$. A vertical fin 131 on the first bottom source/drain can be separated from an adjacent vertical fin 131 on the neighboring second bottom source/drain by a distance, $D_1$.

In one or more embodiments, a gate structure can be formed on each of the vertical fins 131, where a single gate structure may be on two adjacent vertical fins and on top of the shallow trench isolation (STI) region 195. The shallow trench isolation region 195 can be self-aligned with the one vertical fin 131 on the first bottom source/drain 123 and the one adjacent vertical fin 131 on the neighboring second bottom source/drain 123. In various embodiments, the shallow trench isolation region has a width in the range of about 10 nm to about 40 nm.

In one or more embodiments, a top source/drain 300 can be formed on each of the at least two vertical fins 131 on the first bottom source/drain 123 and on the at least two vertical fins 131 on the second bottom source/drain 123. A merged top source/drain 301 can be formed on one vertical fin 131 on the first bottom source/drain 123 and one adjacent vertical fin 131 on the second bottom source/drain 123 that bridges the shallow trench isolation region 195 to electrically couple the adjacent vertical fins. The shallow trench isolation region 195 can separate a first fin field effect transistor device from a second fin field effect transistor device.

In one or more embodiments, two top source/drain 300 can be epitaxially grown to a size that is sufficient to span the distance, $D_1$, between two adjacent vertical fins 131 on separate bottom source/drains 123 to form a merged source/drain 301. The at least two vertical fins 131 on the first bottom source/drain 123 can form a first fin field effect transistor device, and the at least two vertical fins 131 on the second bottom source/drain 123 can form a second fin field effect transistor device, where the two fin field effect transistor devices can be physically adjoined and electrically coupled in series through the merged top source/drain 301.

In one or more embodiments, an electrical path can be formed from a top source/drain 300 through a vertical fin 131 of a first FinFET device to a first bottom source/drain 123, through a second vertical fin to the merged top source/drain 301 to a vertical fin of a second FinFET device, through the second bottom source/drain 123 and through a second vertical fin 131 and top source/drain 300 on the second bottom source/drain 123.

In a non-limiting exemplary embodiment, an adjoined pair of vertical fin devices can include a first bottom source/drain and a second bottom source/drain on a substrate, wherein the first bottom source/drain is separated from the second bottom source/drain by a shallow trench isolation region in the substrate, at least four vertical fins, wherein at least two of the four vertical fins are on the first bottom source/drain and the remaining vertical fins are on a second bottom source/drain, a gate structure on each of the at least four vertical fins, a top source/drain on at least one of the at least two vertical fins on the first bottom source/drain, a top source/drain on at least one of the remaining vertical fins on the second bottom source/drain, and a merged source/drain on one vertical fin on the first bottom source/drain and one adjacent vertical fin on the second bottom source/drain that bridges the shallow trench isolation region to electrically couple the adjacent vertical fins.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" to and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper", and the like, can be used herein for ease of description to describe one element's or feature's relationship to another element(s) or features) as illustrated in the FIGS. It will be understood that the spatially relative terms are intended to encompass different orientations of the device in use or operation in addition to the orientation depicted in the FIGS. For example, if the device in the FIGS. is turned over, elements described as "below" "beneath" other elements or features would then be oriented "above" the other elements or features. Thus, the teen "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and fabrication method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of fabricating a vertical fin field effect transistor with a merged top source/drain, comprising:
   forming a source/drain layer at the surface of a substrate;
   forming a plurality of vertical fins on the source/drain layer;
   forming protective spacers on each of the plurality of vertical fins;
   forming a sacrificial plug between two protective spacers;
   forming a filler layer on the protective spacers not in contact with the sacrificial plug;
   selectively removing the sacrificial plug to form an isolation region trench between the two protective spacers;
   extending the isolation region trench through the source/drain layer into the substrate; and
   forming a dummy layer in the isolation region trench.

2. The method of claim 1, further comprising patterning the dummy layer and forming at least two additional isolation region trenches in the source/drain layer and substrate.

3. The method of claim 2, further comprising removing the dummy layer and forming a trench fill layer in the at least three isolation region trenches.

4. The method of claim 3, further comprising etching back the trench fill layer to form a plurality of shallow trench isolation regions, and forming a gate structure on each of the plurality of vertical fins.

5. The method of claim 4, further comprising forming a top source/drain on each of the plurality of vertical fins having a predetermined size, where the predetermined size is sufficient for at least two top source/drains to coalesce into the merged top source/drain.

6. The method of claim 5, wherein the distance between at least two adjacent vertical fins of the plurality of vertical fins is in the range of about 10 nm to about 40 nm, and the predetermined size of the at least two top source/drains is greater than the distance between the at least two adjacent vertical fins.

7. The method of claim 6, wherein the distance between adjacent pairs of vertical fins of the plurality of vertical fins other than the at least two adjacent vertical fins is in the range of about 30 nm to about 100 nm, and the predetermined size of the top source/drains other than the at least two top source/drains is less than the distance between the adjacent pairs of vertical fins of the plurality of vertical fins other than the at least two adjacent vertical fins.

8. A method of fabricating two vertical fin field effect transistors electrically coupled through a merged top source/drain, comprising:
   forming a source/drain layer on a substrate;
   forming at least four vertical fins on the source/drain layer;
   forming a protective spacer on the sidewalls of each of the at least four vertical fins;
   forming an isolation region through the source/drain layer by forming an isolation region trench between two facing protective spacers on two adjacent vertical fins, forming a dummy layer in the isolation region trench, removing the dummy layer, and forming a trench fill layer in the isolation region trench to separate the source/drain layer into a first bottom source/drain and a second bottom source/drain, wherein at least two of the least four vertical fins are on the first bottom source/drain, and at least two of the at least four vertical fins are on the second bottom source/drain; and
   forming a top source/drain on each of the at least four vertical fins, wherein the top source/drains are formed to a size that is sufficient for at least two top source/drains to coalesce into the merged top source/drain.

9. The method of claim 8, wherein the at least two vertical fins on the first bottom source/drain are separated by a distance in the range of about 30 nm to about 100 nm, and the at least two vertical fins on the second bottom source/drain are separated by a distance in the range of about 30 nm to about 100 nm.

10. The method of claim 8, wherein one vertical fin on the first bottom source/drain is separated from an adjacent vertical fin on the second bottom source/drain by a distance in the range of about 10 nm to about 40 nm.

11. The method of claim 8, wherein the top source/drains are epitaxially grown on each of the at least four vertical fins.

12. The method of claim 11, further comprising forming a gate structure on each of the at least four vertical fins.

13. The method of claim 12, further comprising forming electrical contacts to at least one top source/drain on the first bottom source/drain that is not the merged top source/drain, and forming electrical contacts to at least one top source/drain on the second bottom source/drain that is not the merged top source/drain.

\* \* \* \* \*